(12) United States Patent
Blake, III (10) Patent No.: US 11,026,322 B2
(45) Date of Patent: Jun. 1, 2021

(54) PCB STRAIN RELIEF

(71) Applicant: TRW AUTOMOTIVE U.S. LLC, Livonia, MI (US)

(72) Inventor: Thomas E. Blake, III, Novi, MI (US)

(73) Assignee: TRW AUTOMOTIVE U.S. LLC, Livonia, MI (US)

(*) Notice: Subject to any disclaimer, the term of this patent is extended or adjusted under 35 U.S.C. 154(b) by 186 days.

(21) Appl. No.: 16/155,244

(22) Filed: Oct. 9, 2018

(65) Prior Publication Data
US 2020/0113044 A1 Apr. 9, 2020

(51) Int. Cl.
| | |
|---|---|
| H05K 5/00 | (2006.01) |
| H05K 1/02 | (2006.01) |
| H05K 1/14 | (2006.01) |
| H05K 1/18 | (2006.01) |
| G01L 17/00 | (2006.01) |
| H04N 5/225 | (2006.01) |

(52) U.S. Cl.
CPC ........... *H05K 1/0271* (2013.01); *H05K 1/141* (2013.01); *H05K 1/181* (2013.01); *H05K 5/0004* (2013.01); *G01L 17/00* (2013.01); *H04N 5/2253* (2013.01); *H05K 2201/049* (2013.01); *H05K 2201/09063* (2013.01); *H05K 2201/09163* (2013.01); *H05K 2201/10151* (2013.01); *H05K 2201/10409* (2013.01)

(58) Field of Classification Search
CPC ...... H05K 1/0271; H05K 1/141; H05K 1/181; H05K 5/0004; H05K 2201/049; H05K 2201/09063; H05K 2201/09163; H05K 2201/10151; H05K 2201/10409; G01L 17/00; H04N 5/2253
USPC .......................................... 361/748
See application file for complete search history.

(56) References Cited

U.S. PATENT DOCUMENTS

| | | | |
|---|---|---|---|
| 4,931,021 A * | 6/1990 | Mohan | G02B 6/3833 439/284 |
| 5,857,799 A | 1/1999 | Blake, III | |
| 7,371,071 B2 * | 5/2008 | Cho | H01L 23/13 257/E23.004 |

OTHER PUBLICATIONS

BRP65XXX9 Product Data Sheet—Retrieved From Internet on Jul. 30, 2018.
Powerpoint Slide—Grand Cherokee Main PCT FN Partition—Top—2016.

* cited by examiner

*Primary Examiner* — Binh B Tran
(74) *Attorney, Agent, or Firm* — Tarolli, Sundheim, Covell & Tummino LLP (57) ABSTRACT

An electronic device includes a printed circuit board having at least one edge and a strain relief including a plurality of overlapping, spaced-apart slots that cooperate with the at least one edge to define a resilient tab for redistributing strain induced in the printed circuit board.

21 Claims, 8 Drawing Sheets

PCB STRAIN RELIEF

TECHNICAL FIELD

The present invention relates generally to electronics and, more specifically, relates to a strain relief for an electronic device.

BACKGROUND

Printed circuit boards (PCBs) are used in a wide range of vehicle applications for mounting sensors, such as image sensors, rain sensors, proximity sensors, light sensors, etc., used to assist operation of the vehicle. The sensor can be secured to the PCB with electrically conductive solder. The PCBs can be connected to another PCB, motherboard or other component or substrate by fasteners, adhesive and/or compression between enclosure components. The interface between the connection and the PCB can experience high levels of strain.

SUMMARY

In one aspect, an electronic device includes a printed circuit board having at least one edge and a strain relief including a plurality of overlapping, spaced-apart slots that cooperate with the at least one edge to define a resilient tab for redistributing strain induced in the printed circuit board.

In another aspect, electronic device includes a printed circuit board having first and second edges extending transverse to one another. A strain relief includes a plurality of overlapping, spaced-apart slots that cooperate with the first and second edges to define a resilient tab. The plurality of slots includes a first slot extending away from the first edge. A second slot extends away from the second edge. A third slot overlaps the first and second slots to form the resilient tab. A sensor is provided on the printed circuit board such that the strain relief redistributes strain away from the sensor.

Other objects and advantages and a fuller understanding of the invention will be had from the following detailed description and the accompanying drawings.

DETAILED DESCRIPTION

Figure 1:
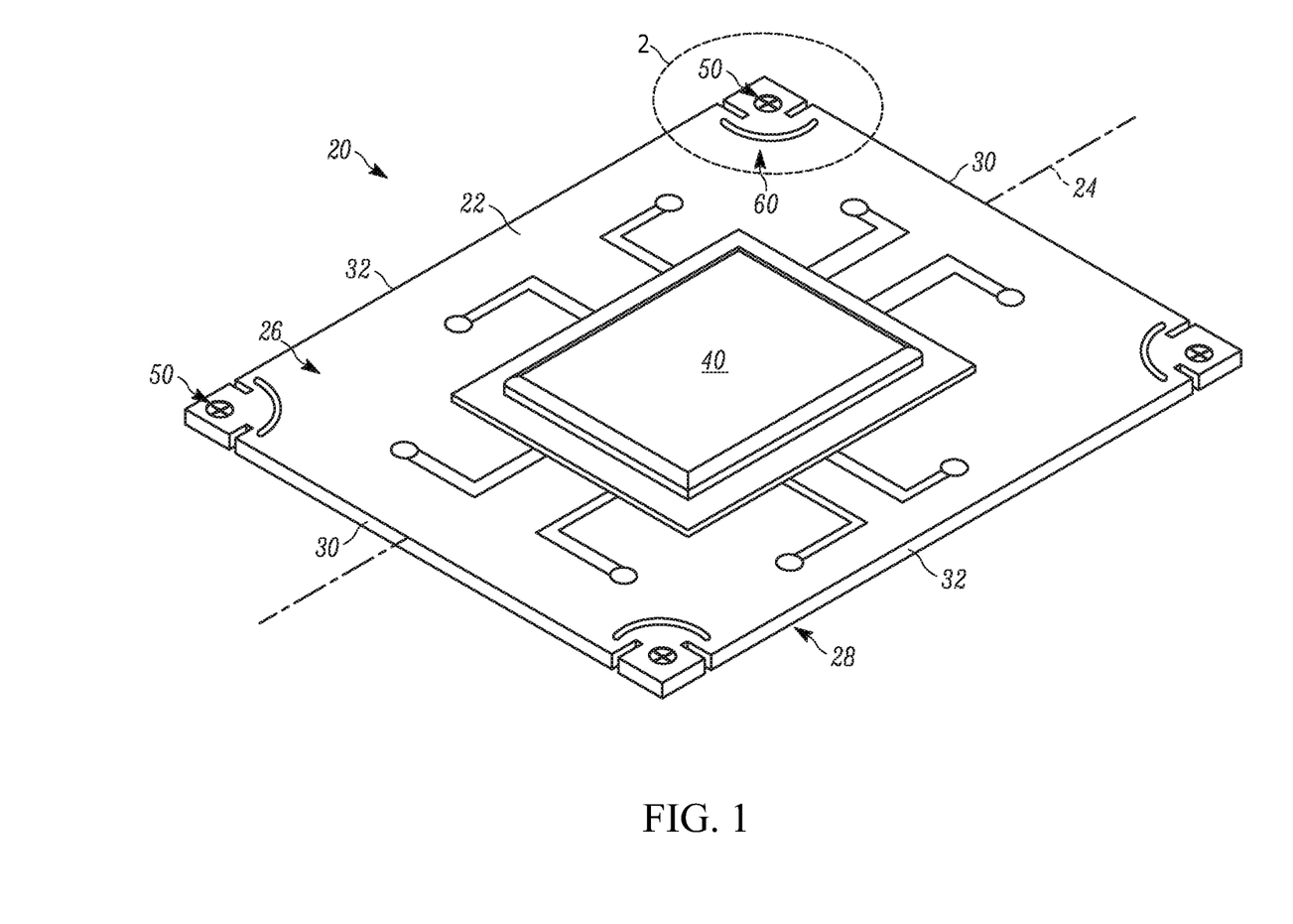
FIG. 1 is a schematic illustration of an example electronic device having a strain relief in accordance with the present invention.
Figure 2:
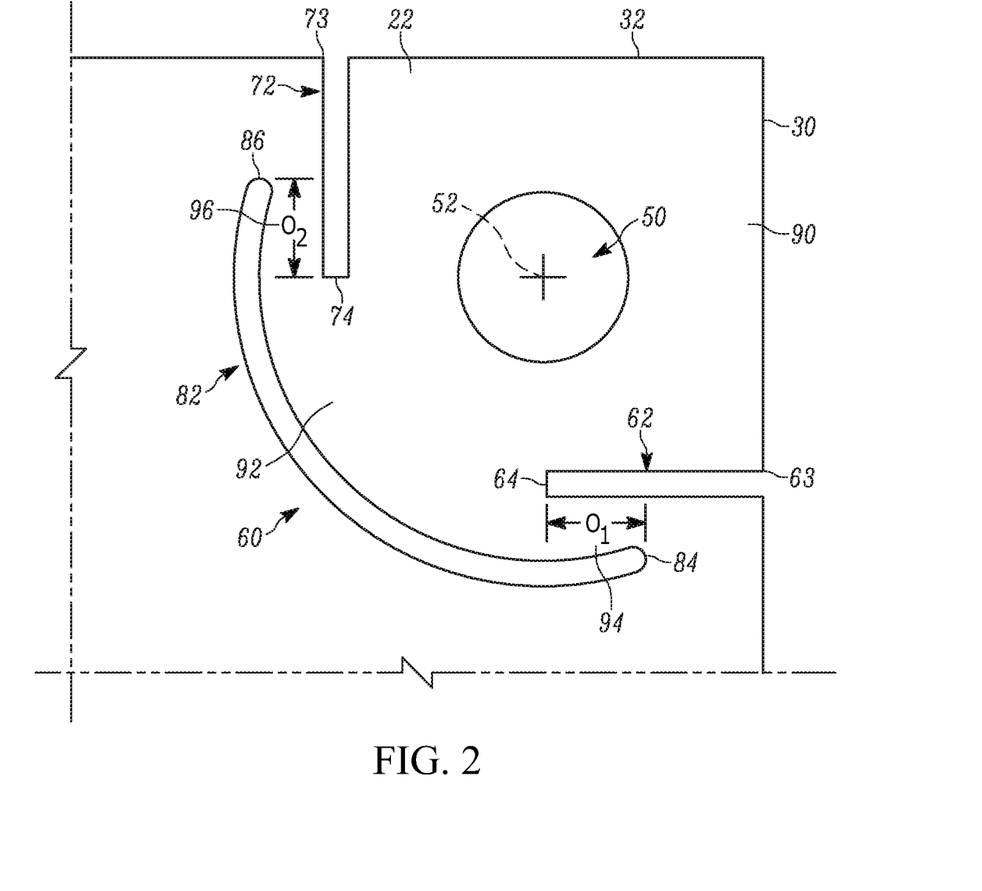
FIG. 2 is an enlarged view of the strain relief of FIG. 1.

The present invention relates generally to electronics and, more specifically, relates to a strain relief for an electronic device. FIGS. 1-2 illustrate one example electronic device 20. Referring to FIG. 1, the electronic device 20 includes a printed circuit board (PCB) 22 extending along a centerline 24 and including a first side 26 and a second side 28. The PCB 22 can be polygonal (square, rectangular, etc.) or round (not shown). As shown, the PCB 22 is rectangular and includes a pair of first edges 30 extending perpendicular to the centerline 24. A pair of second edges 32 extends parallel to the centerline 24 and interconnects the first edges 30. The first and second edges 30, 32 collectively define the perimeter of the PCB 22.

A sensor 40 is secured to the first side 26 of the PCB 22. The sensor 40 can be, for example, an image sensor, rain sensor, proximity sensor, light sensor or pressure sensor. Alternatively, the sensor 40 can be omitted (not shown). The sensor 40 can be secured to the PCB 22 by, for example, solder formed as a ball grid array (BGA) or a pin grid array (not shown) that is heated to undergo reflow in order to secure the sensor to the PCB 22. The solder is formed from an electrically conductive material.

One or more openings 50 extend through the PCB 22 from the first side 26 to the second side 28. As shown, four openings 50 extend through the PCB 22 at each corner thereof. The openings 50 are symmetrically arranged about the centerline 24 although other configurations are contemplated. Each opening 50 is circular and centered about an axis 52 (see FIG. 2).

A strain relief 60 is associated with each opening 50 for helping to reduce or alleviate strain on the PCB 22 during/when connected to another component. The strain relief 60 includes a plurality of spaced-apart slots extending through the PCB 22. As shown in FIG. 2, each strain relief 60 includes a first slot 62 extending away from the first edge 30 toward the interior of the PCB. The first slot 62 can extend parallel to the second edge 32 (as shown) or transverse to the second edge (not shown). The first slot 62 extends from a peripheral end point 63 to an interior end point 64. The end point 63 can be at the first edge 30 (as shown) or spaced therefrom (not shown). The end point 64 can be substantially aligned with the axis 52 of the opening 50 (vertically aligned as shown in FIG. 2).

A second slot 72 extends away from the second edge 32 toward the interior of the PCB. The second slot 72 can extend parallel to the first edge 30 (as shown) or transverse to the second edge (not shown). The second slot 72 extends from a peripheral end point 73 to an interior end point 74. The end point 73 can be at the second edge 32 (as shown) or spaced therefrom (not shown). The end point 74 can be substantially aligned with the axis 52 of the opening 50 (horizontally aligned as shown in FIG. 2). The end points 64, 74 can therefore be located at substantially 90° from one another about the axis 52. The end points 64, 74 can be along straight lines (as shown) or curved lines (not shown).

Although the first and second slots 62, 72 are shown as linear it will be appreciated that one or both of the first and second slots can be curved. The first and second slots 62, 72 can extend the same length along the PCB 22 or different lengths (not shown). The first and second slots 62, 72 can have the same width along the PCB 22 or different widths (not shown). The widths of the slots 62, 72 can be constant or variable.

A third slot 82 is positioned interior of the first and second slots 62, 72 and extends from adjacent the first slot 62 to adjacent the second slot 72. The third slot 82 is curved and extends circumferentially about the axis 52 of the opening 50. The third slot 82 extends to an end point 84 adjacent the end point 64 of the first slot 62 and to an end point 86 adjacent the end point 74 of the second slot 72. The end point 84 is closer to the first edge 30 than the end point 64 such that the third slot 82 overlaps with the first slot 62 by a distance $O_1$. The end point 86 is closer to the second edge 32 than the end point 74 such that the third slot 82 overlaps with the second slot 72 by a distance $O_2$. The distances $O_1$, $O_2$ can be the same or different from one another. Each of the first, second, and third slots 62, 72, 82 can extend entirely through the PCB 22 (as shown) or partially therethrough (not shown).

The edges 30, 32 and strain relief 60 cooperate to define a flexible or resilient tab 90 on the PCB 22. When the PCB 22 is rectangular, the tab 90 can be located in one or more of the corners. A tab 90 could also be formed adjacent an interior opening (not shown) in the PCB 22 and utilizing one or more edges defining the opening. In any case, in the example shown each tab 90 includes the opening 50.

The tab 90 remains connected to the remainder of the PCB 22 by a hinge 92 and a pair of peripheral portions 94, 96 on opposite sides of the hinge portion. The hinge 92 is located between the opening 50 and the third slot 82. The peripheral portion 94 is located between the first slot 62 and the third slot 82. The peripheral portion 96 is located between the second slot 72 and the third slot 82. Consequently, the overlap distances $O_1$, $O_2$ help define the lengths of the peripheral portions 94, 96. The hinge 92 and peripheral portions 94, 96 cooperate to allow the tab 90 to pivot relative to the remainder of the PCB 22 in a direction generally along or parallel to the axis 52 of the opening 50.

Figure 3A:
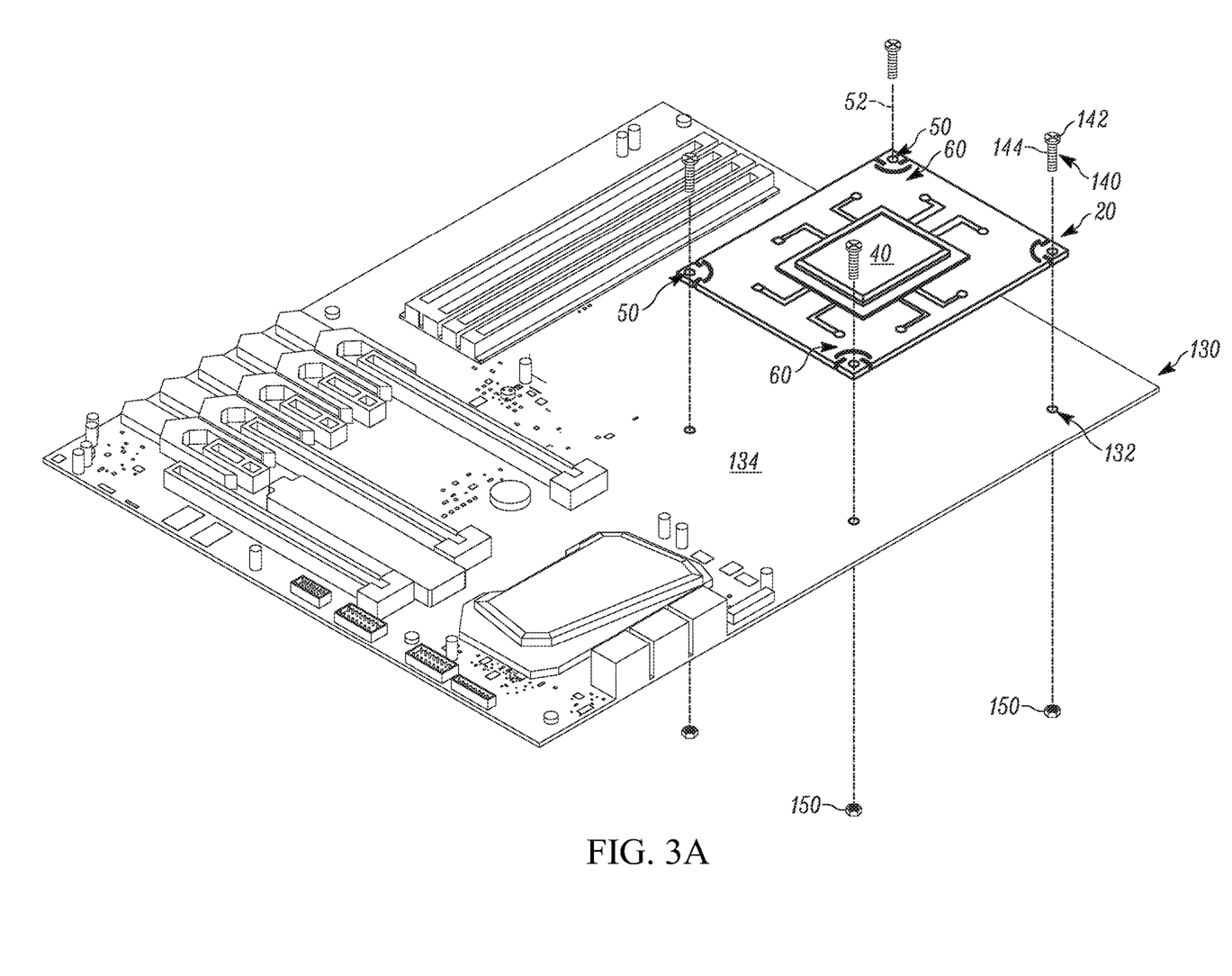
FIG. 3A is an exploded view of the electronic device being connected to a motherboard.
Figure 3B:
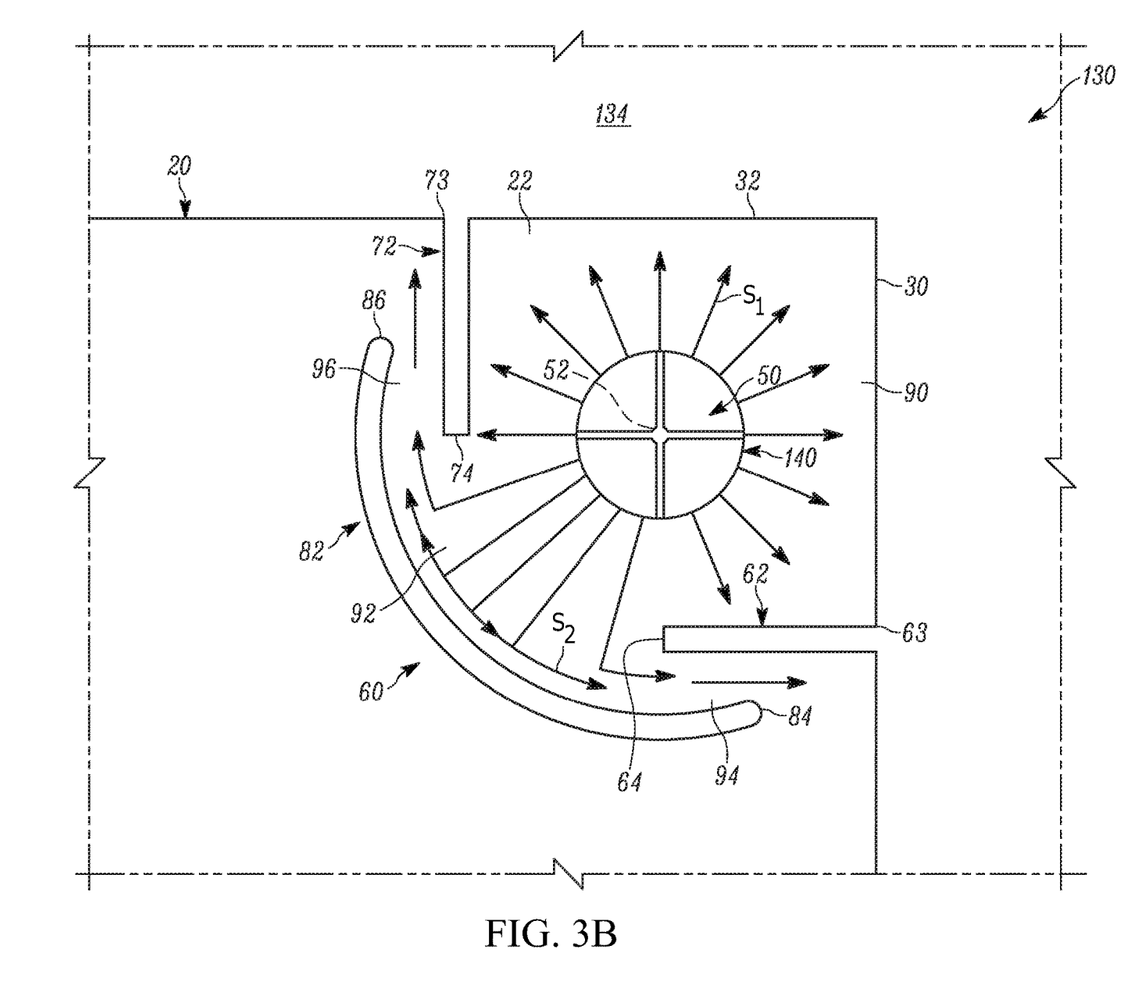
FIG. 3B is an enlarged, top view of a portion of the electronic device connected to the motherboard.

Referring to FIGS. 3A-3B, the electronic device 20 is secured to an electronic component, e.g., a motherboard or main PCB 130. In one example, fasteners 140 are used to connect the electronic device 20 to the motherboard 130. Each fastener 140 includes a head 142 and a threaded shaft 144 extending from the head. The fasteners 140 extend through the openings 50 in the PCB 22 and corresponding openings 132 in the motherboard 130. As a result, the heads 142 of the fasteners 140 engage the PCB 22. The shafts 144 extend through both openings 50, 132. Nuts 150 are connected to the shafts 144 to clamp the PCB 22 to the motherboard 130.

When the PCB 22 and motherboard 130 are connected together (FIG. 3B), strain can be generated in one or more ways. First, strain can be generated in the PCB 22 along the interface between the head 142 of each fastener 140 and the tab 90 on the PCB, i.e., around the opening 50. Stain can also be induced in the PCB 22 when the surface 134 is uneven or not parallel to the second side 28 of the PCB or when electrical components, e.g., solder traces, extend along the surface 134.

Regardless, the tab 90 is stressed when connected to the motherboard 130 and strain induced therein. The strain radiates outward in every direction from the opening 50 in the manner $S_1$ towards the edges 30, 32 and image sensor 40. The strain relief 60, however, advantageously redirects a portion of the strain that would propagate towards the image sensor 40 to instead be redirected in the manner $S_2$ towards the edges 30, 32 of the PCB 22. More specifically, strain reaching the portion 92 is redirected outwards along the peripheral portions 94, 96 between the overlapping slots 62, 72, 82 and towards the edges 30, 32. Consequently, strain that would otherwise propagate to or adjacent to the image sensor 40 is instead redirected away from the image sensor. This unaltered strain direction/distribution could be excessive around the image sensor 40, possibly leading to damage to the PCB 22 and/or to the solder BGA connecting the image sensor to the PCB. The strain relief 60 thereby also helps prevent cracking of the PCB 22 around the image sensor 40.

The resilient nature of the tab 90 also allows the strain to be released/redistributed because the tab can pivot or flex about the hinge 92 relative to the remainder of the PCB 22. The flexing helps prevent the strain from becoming excessive and causing damage to the PCB 22 or PCB/sensor 40 connection.

Although the fasteners 140 shown are screws cooperating with nuts 150, it will be appreciated that other structure can extend through the openings 50 for connecting the electronic device 20 to the motherboard 130, e.g., rivets, plastic bosses to be heat staked, etc. In any case, the strain relief 60 redistributes strain induced by the PCB 22/motherboard 130 connection away from the image sensor 40

Figure 4:
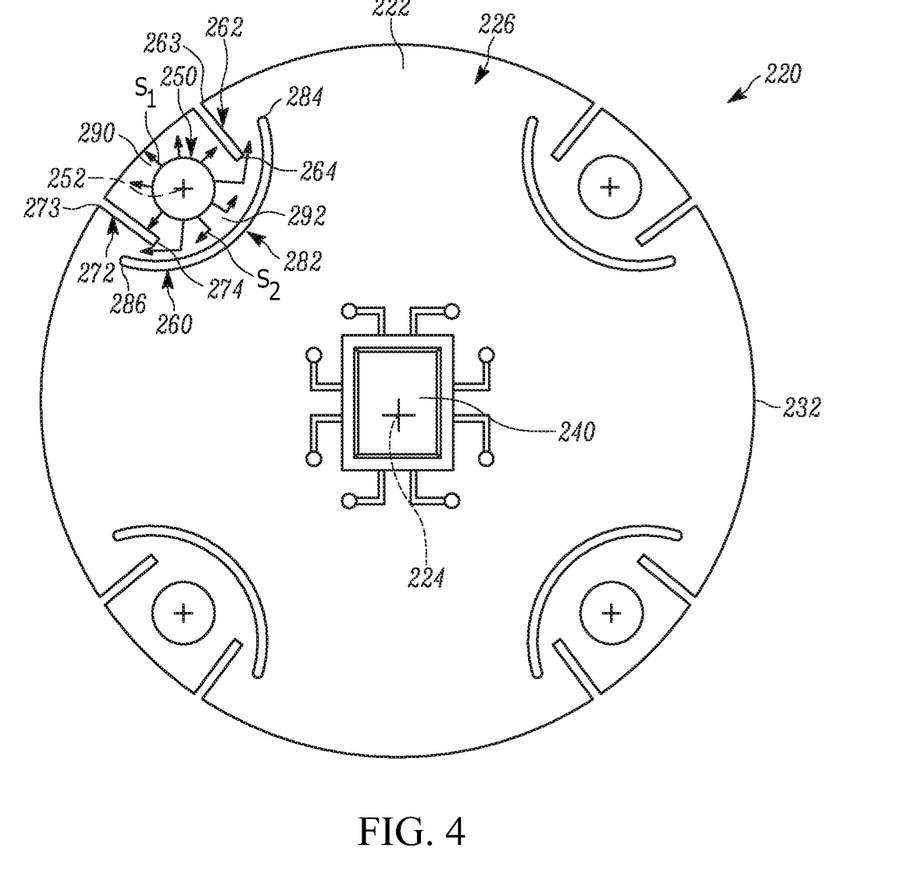
FIG. 4 is a schematic illustration of another example electronic device.

FIG. 4 illustrates another example electronic device 220 in accordance with the present invention. Features in FIG. 4 that are similar to the features in FIGS. 1-2 are given a reference number 200 greater than the corresponding feature. In FIG. 4, the PCB 222 is circular and therefore has a single edge 232. The PCB 222 is centered about a centerline 224. Four openings 250 extend through the PCB 222 from the first side 226 to the second side (not shown). The openings 250 are symmetrically arranged about the centerline 224. Each opening 250 is circular and centered about an axis 252.

A strain relief 260 is associated with each opening 250 for helping to reduce or alleviate strain on the PCB 222 during attachment to the motherboard (not shown). The first and second slots 262, 272 extend from the edge 232 radially inward generally toward the centerline 224. The first and second slots 262, 272 can extend parallel to one another (as shown) or transverse to one another (not shown). The first and second slots 262, 272 can extend towards the centerline 224. In any case, the first and second slots 262, 272 are positioned on opposite sides of the opening 250 from one another. The third slot 282 is positioned radially inward of the first and second slots 262, 272 and overlaps with each of the first and second slots. Consequently, strain induced in the tab 290 during connection to the motherboard is directed radially outward in the manner $S_2$ towards the single edge 232 instead of being permitted to pass radially inward towards/to the image sensor 240.

Figure 5:
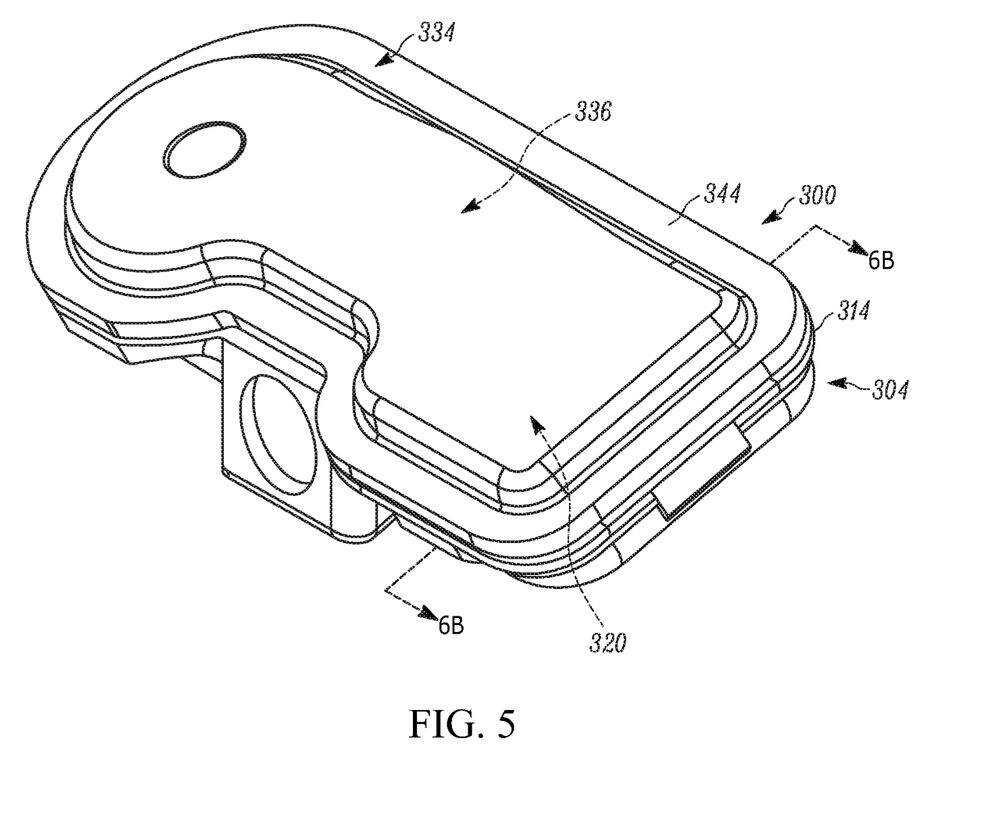
FIG. 5 is a schematic illustration of a tire pressure monitoring (TPM) sensor including another example electronic device.
Figure 6A:
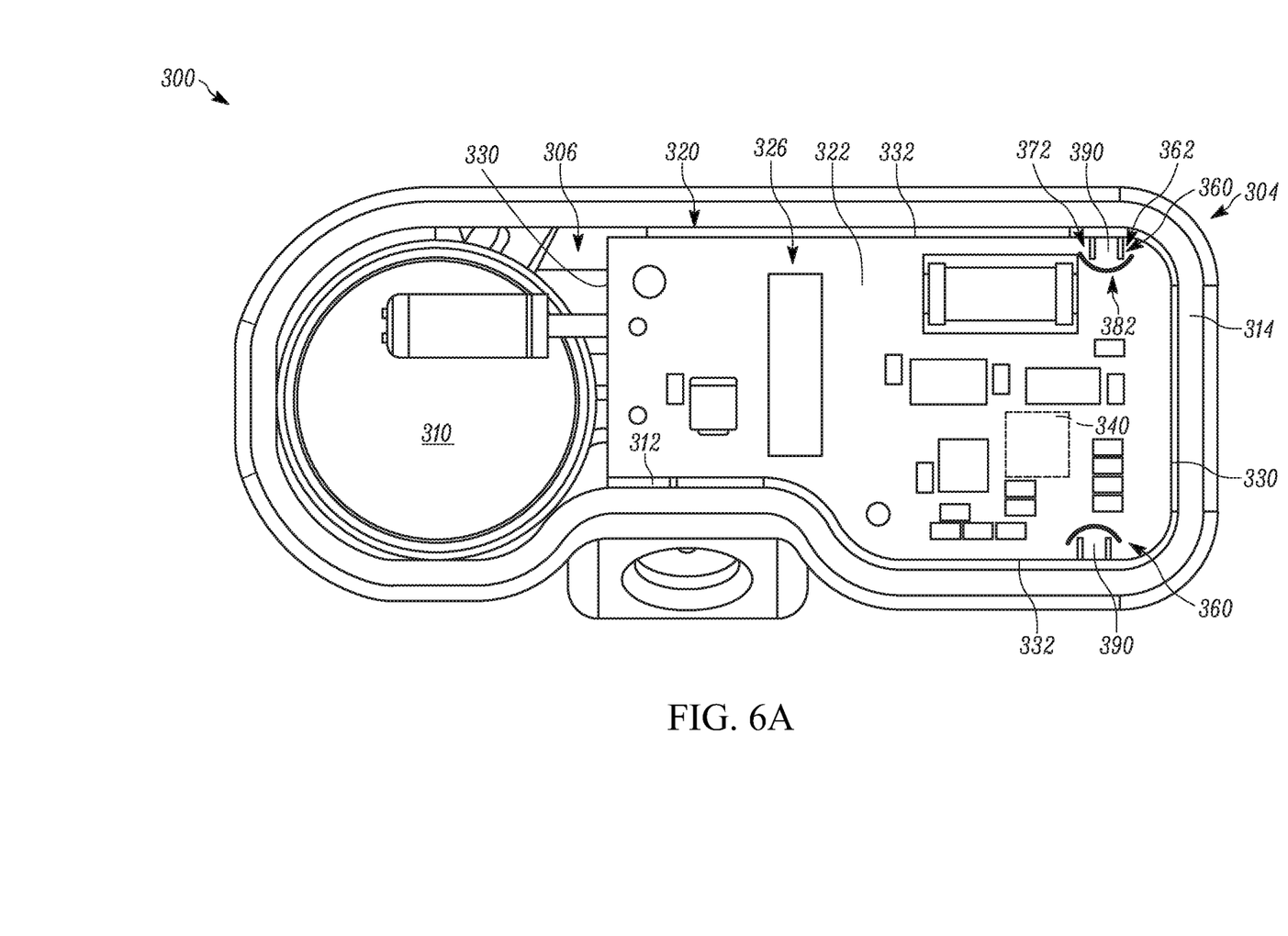
FIG. 6A is a top view of the TPM sensor of FIG. 5 with a cover removed.
Figure 6B:
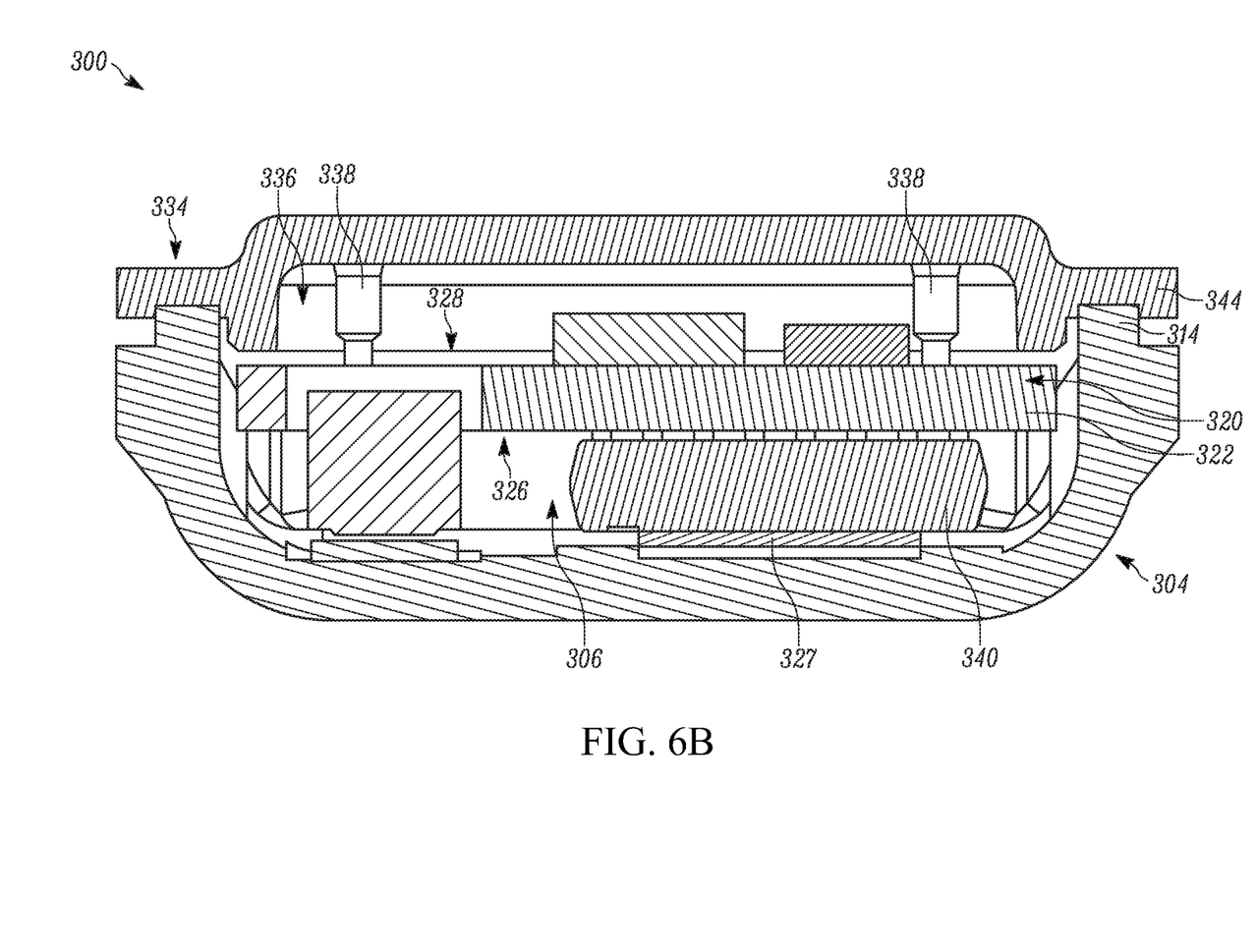
FIG. 6B is a sectional view of the TPM sensor of FIG. 5 taken along line 6B-6B.

FIGS. 5-6B illustrate an example electronic device 320 used in a tire pressure monitoring (TPM) sensor 300. The TPM sensor 300 includes a housing 304 and a cover 334 that cooperate to enclose the electronic device 320. Referring to FIGS. 6A-6B, the housing 304 defines a cavity 306 that receives a battery 310 electrically connected to the electronic device 320. A projection 312 extends within the cavity 306 between sides of the housing 304 (top and bottom sides as shown in FIG. 6A). A rib 314 extends around the perimeter of the housing 304.

The PCB 322 in the electronic device 320 is generally rectangular and includes first edges 330 and second edges 332. The sensor 340 is a pressure sensor secured to the first side 326 of the PCB 322. A compression gasket 327 is secured to the pressure sensor 340 on a side facing away from the PCB 322. One or more strain reliefs 360 are provided on the PCB 322 adjacent the second edges 332 to define resilient tabs 390 on the PCB 322. To this end, the third slot 382 overlaps with the first and second slots 362, 372 extending to the second edges 332 of the PCB 322.

The cover 334 has the same shape as the housing 304 and defines a cavity 336. Contact supports 338 extend from the underside of the cover 334 into the cavity 336 at predetermined locations. The contact supports 338 can be integrally formed with the cover 334 or secured thereto. A rib 344 extends around the perimeter of the cover 334 for mating with the rib 314 on the housing 304.

To assemble the TPM sensor 300, the electronic device 320 is placed within the cavity 306 so as to be supported in the housing 304 by the projection 312 and the compression gasket 327. Consequently, the pressure sensor 340 and gasket 327 are positioned between the PCB 322 and the housing 304. The second side 328 of the PCB 322 faces away from the housing 304. The cover 344 is placed on the housing 304 with the ribs 314, 344 engaging one another. As a result, the contact supports 338 are aligned with and engage the tabs 390 on the PCB 322, thereby inducing strain therein. The ribs 314, 344 are laser welded together to securely enclose the electronic device 320 between the housing 304 and the cover 334. Due to the resilient nature of the tabs 390 afforded by the strain reliefs 360, the tabs redistribute the strain induced by the contact supports 338 engaging the tabs 390 towards the second edges 332 of the PCB 322 and away from the pressure sensor 340 and other components on the PCB.

The electronic device described herein is advantageous in that areas of high strain in the PCB where localized connections to other electronic components exist are redistributed from paths directed towards electronic components, e.g., sensors, to paths directed away from the electronic components. This redistribution not only helps to prevent excessive strain on the electronic components but also on any solder that may be present on the PCB. Consequently, the integrity of the electronic components and solder can be maintained while also providing a secure connection between the electronic device and any component secured thereto.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An electronic device, comprising:
   a printed circuit board including at least one edge and a strain relief comprising a plurality of overlapping, spaced-apart slots that cooperate with the at least one edge to define a resilient tab for redistributing strain induced in the printed circuit board; and
   a sensor provided on the printed circuit board such that the strain relief redistributes strain away from the sensor.

2. The electronic device recited in claim 1, wherein the at least one edge includes first and second edges extending transverse to one another.

3. The electronic device recited in claim 2, wherein the plurality of slots comprises:
   a first slot extending from the first edge;
   a second slot extending from the second edge; and
   a third slot overlapping the first and second slots to form the resilient tab.

4. The electronic device recited in claim 3 further comprising an opening extending through the printed circuit board and being positioned on the resilient tab for receiving a fastener to secure the printed circuit board to an electronic component.

5. The electronic device recited in claim 4, wherein the opening is centered on an axis and the third slot extends circumferentially about the axis.

6. The electronic device recited in claim 3, wherein the first and second slots are linear and the third slot is arcuate.

7. The electronic device recited in claim 1, wherein the printed circuit board is circular such that the at least one edge comprises a single edge encircling a centerline.

8. The electronic device recited in claim 7, wherein the at least one slot comprises:
   first and second slots extending from the single edge towards the centerline; and
   a third slot overlapping the first and second slots to form the resilient tab.

9. The electronic device recited in claim 7 further comprising an opening extending through the printed circuit board and being positioned on the resilient tab for receiving a fastener to secure the printed circuit board to a substrate.

10. The electronic device recited in claim 9, wherein the opening is centered on an axis and the third slot extends circumferentially about the axis.

11. The electronic device recited in claim 7, wherein the first and second slots are linear and the third slot is arcuate.

12. An electronic device, comprising:
    a printed circuit board including first and second edges extending transverse to one another and a strain relief comprising a plurality of overlapping, spaced-apart slots that cooperate with the first and second edges to define a resilient tab, the plurality of slots comprising:
    a first slot extending away from the first edge;
    a second slot extending away from the second edge; and
    a third slot overlapping the first and second slots to form the resilient tab; and
    a sensor provided on the printed circuit board such that the strain relief redistributes strain away from the sensor.

13. The electronic device recited in claim 12, wherein the first and second edges extend transverse to one another, the first slot extending from the first edge and the second slot extending from the second edge.

14. The electronic device recited in claim 12 further comprising an opening extending through the printed circuit board and being positioned on the resilient tab for receiving a fastener to secure the printed circuit board to an electronic component.

15. The electronic device recited in claim 14, wherein the opening is centered on an axis and the third slot extends circumferentially about the axis.

16. The electronic device recited in claim 12, wherein the first and second slots are linear and the third slot is arcuate.

17. An electronic device, comprising:
    a printed circuit board including at least one edge and a strain relief comprising a plurality of overlapping, spaced-apart slots that cooperate with the at least one edge to define a resilient tab for redistributing strain induced in the printed circuit board, the at least one edge including first and second edges extending transverse to one another, the plurality of slots including:
    a first slot extending from the first edge;
    a second slot extending from the second edge; and
    a third slot overlapping the first and second slots to form the resilient tab.

18. The electronic device recited in claim 17 further comprising a sensor provided on the printed circuit board such that the strain relief redistributes strain away from the sensor.

19. The electronic device recited in claim 17 further comprising an opening extending through the printed circuit board and being positioned on the resilient tab for receiving a fastener to secure the printed circuit board to an electronic component.

20. The electronic device recited in claim 19, wherein the opening is centered on an axis and the third slot extends circumferentially about the axis.

21. The electronic device recited in claim 19, wherein the first and second slots are linear and the third slot is arcuate.

\* \* \* \* \*